United States Patent
Nam et al.

(10) Patent No.: US 7,830,226 B2
(45) Date of Patent: Nov. 9, 2010

(54) FILM BULK ACOUSTIC RESONATOR FILTER AND DUPLEXER

(75) Inventors: Kuang-woo Nam, Suwon-si (KR); Yun-kwon Park, Dongducheon-si (KR); In-sang Song, Seoul (KR); Chul-soo Kim, Hwaseong-si (KR); Eun-seok Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 224 days.

(21) Appl. No.: 11/808,066

(22) Filed: Jun. 6, 2007

(65) Prior Publication Data

US 2008/0100397 A1 May 1, 2008

(30) Foreign Application Priority Data

Oct. 31, 2006 (KR) ........................ 10-2006-0106554

(51) Int. Cl.
*H03H 9/70* (2006.01)
*H03H 9/54* (2006.01)

(52) U.S. Cl. ...................................... 333/133; 333/189
(58) Field of Classification Search ................. 333/133, 333/187, 189
See application file for complete search history.

(56) References Cited

U.S. PATENT DOCUMENTS

| | | | | |
|---|---|---|---|---|
| 5,231,327 A | * | 7/1993 | Ketcham | 310/366 |
| 5,631,612 A | * | 5/1997 | Satoh et al. | 333/193 |
| 5,789,845 A | * | 8/1998 | Wadaka et al. | 310/334 |
| 5,963,113 A | * | 10/1999 | Ou et al. | 333/193 |
| 6,031,435 A | * | 2/2000 | Inose et al. | 333/193 |
| 6,150,904 A | * | 11/2000 | Taniguchi et al. | 333/193 |
| 6,677,835 B2 | * | 1/2004 | Noguchi et al. | 333/193 |
| 6,741,145 B2 | * | 5/2004 | Tikka et al. | 333/133 |
| 2003/0186673 A1 | * | 10/2003 | Kimachi et al. | 455/339 |
| 2006/0066419 A1 | * | 3/2006 | Iwaki et al. | 333/133 |
| 2006/0132260 A1 | * | 6/2006 | Iwamoto et al. | 333/133 |
| 2006/0139120 A1 | * | 6/2006 | Yamaguchi et al. | 333/133 |
| 2007/0030096 A1 | * | 2/2007 | Nishihara et al. | 333/133 |
| 2007/0046395 A1 | * | 3/2007 | Tsutsumi et al. | 333/133 |
| 2007/0080756 A1 | * | 4/2007 | Aigner et al. | 333/133 |
| 2008/0136555 A1 | * | 6/2008 | Schmidhammer | 333/129 |

FOREIGN PATENT DOCUMENTS

| | | | |
|---|---|---|---|
| DE | 10 2004 053 319 A1 | * | 5/2006 |
| JP | 2002-217676 | * | 8/2002 |
| JP | 2003-110404 | * | 4/2003 |
| KR | 2005-0010663 A | | 1/2005 |

OTHER PUBLICATIONS

Machine translation of JP 2003-110404 published Apr. 11, 2003.*
English language machine translation of JP 2002-217676 published Aug. 2, 2002.*

* cited by examiner

*Primary Examiner*—Barbara Summons
(74) *Attorney, Agent, or Firm*—NSIP Law

(57) ABSTRACT

A film bulk acoustic resonator (FBAR) filter and a duplexer are disclosed. At least one series resonator is positioned between an input port for inputting a frequency signal and an output port for outputting a frequency signal, at least two shunt resonators respectively positioned between the input and output ports and a ground, a first trimming inductor connects the at least two shunt resonators and the ground, and a second trimming inductor is positioned between the at least two shunt resonators.

10 Claims, 9 Drawing Sheets

US 7,830,226 B2

FILM BULK ACOUSTIC RESONATOR FILTER AND DUPLEXER

CROSS-REFERENCE TO RELATED APPLICATIONS

This application claims the benefit under 35 U.S.C. §119 (a) of Korean Patent Application No. 10-2006-106554, filed in the Korean Intellectual Property Office on Oct. 31, 2006, the entire disclosure of which is hereby incorporated by reference.

BACKGROUND OF THE INVENTION

1. Field of the Invention

The present invention relates to a film bulk acoustic resonator (FBAR) filter and duplexer. More particularly, the present invention relates to a FBAR filter where at least two shunt resonators are connected in parallel and there is at least one trimming inductor therebetween so that attenuation characteristic of the filter is enhanced, and a duplexer thereof.

2. Description of the Related Art

Recently, as mobile communication devices such as mobile phones have become widely used, studies on miniaturization and weight reduction of products have been performed, as well as on an improvement of performance. Filters and duplexers are examples of components that affect the size and weight of mobile communication devices.

A filter is an element for filtering desired frequency signals from a wide frequency band and may be manufactured by producing a series resonator and a shunt resonator individually, then integrating them on a substrate mounted with a trimming inductor.

Accordingly, the size of the filter increases when each resonator is manufactured separately and subsequently attached. Additionally, the efficiency of the filter is reduced by the use of wire bonding for connecting elements and thus increasing parasitic components.

Mobile communication devices generally include a reception filter and a transmission filter. To this end, an individual filter enhances attenuation of a signal of a counterpart frequency band by raising the number of shunt resonators or by using a shunt resonator which is physically larger than a series resonator.

Furthermore, with reference to a conventional filter 100 as shown in FIG. 1, if shunt resonators 121 and 122 are larger than a series resonator 110, the filter 100 is manufactured by connecting the shunt resonators 121 and 122 to trimming inductors 131 and 132, respectively, in order to resolve the increase in the impedance of the filter 100. In the conventional filter 100 corresponding trimming inductors 131 and 132 are required for each of the shunt resonators 121 and 122, resulting in an increase in the size of the filter 100, the difficulty of the manufacturing process, and manufacturing costs.

For example, when the shunt resonators 121 and 122 and the trimming inductors 131 and 132 are connected in as the manner shown in FIG. 1, each of the trimming inductors 131 and 132 should have a capacity of approximately 2~4 nH so that the filter 100 resonates at around 2 GHz.

Moreover, as the filter 100 requires a larger substrate to mount high capacity trimming inductors 131 and 132, a problem arises with the miniaturization of the filter 100 by the on-chip system. Additionally, when fabricating a duplexer having a transmission filter and a reception filter using a conventional filter, at least two high capacity trimming inductors should be used, resulting in an even larger increase in the size of the duplexer, the difficulty of the manufacturing process, and manufacturing costs.

Accordingly, there is a need for an improved apparatus that allows for manufacturing of smaller filter devices while allowing for a simplified manufacturing process and reduced manufacturing costs.

SUMMARY OF THE INVENTION

An aspect of exemplary embodiments of the present invention is to address at least the above problems and/or disadvantages and to provide an FBAR filter and duplexer so as to minimize the size of the filter by manufacturing a plurality of resonators and inductors in a single substrate and accordingly enhance attenuation at high or low frequencies.

In order to achieve the above-described aspects of exemplary embodiments of the present invention, there is provided a film bulk acoustic resonator (FBAR) filter comprising at least one series resonator positioned between an input port for inputting a frequency signal and an output port for outputting a frequency signal, at least two shunt resonators respectively connected between the input and output ports and a ground, a first trimming inductor for connecting the at least two shunt resonators and the ground, and a second trimming inductor positioned between the at least two shunt resonators.

In an exemplary implementation of the present invention, the second trimming inductor is connected to one shunt resonator in parallel, and is connected to the other shunt resonator in series.

In an exemplary implementation of the present invention, the first and second trimming inductors are integrally packaged with the series resonator and the shunt resonators.

In an exemplary implementation of the present invention, a plurality of sub-filters, comprising the at least one series resonator, the at least two shunt resonators first trimming inductor, and the first and second trimming inductors, are connected to each other.

In an exemplary implementation of the present invention, the FBAR filter further comprises at least one attenuation resonator positioned between the plurality of sub-filters.

In order to achieve the above-described aspects of exemplary embodiments of the present invention, there is provided an FBAR filter comprising a plurality of sub-filters connected to each other for filtering a frequency signal, The sub-filter comprises at least one series resonator positioned between an input port for inputting the frequency signal and an output port for outputting the frequency signal, at least two shunt resonators respectively connected between the input and output ports and a ground, and a first trimming inductor for connecting the at least two shunt resonators and the ground.

In an exemplary implementation of the present invention, the FBAR filter further comprises at least one attenuation resonator positioned between the plurality of sub-filters.

In an exemplary implementation of the present invention, the plurality of sub-filters are integrally packaged.

In order to achieve the above-described aspects of exemplary embodiments of the present invention, there is provided a duplexer comprising a first filter for filtering a frequency signal in a first band among frequency signals, the first filter comprising at least one series resonator positioned between an input port for inputting the frequency signal and an output port for outputting the frequency signal; at least two shunt resonators respectively connected between the input and output ports and a ground; a first trimming inductor for connecting the at least two shunt resonators and the ground; and a second trimming inductor positioned between the at least two shunt resonators. The duplexer is additionally provided with a second filter for filtering a frequency signal in a second band among frequency signals, an antenna for receiving the frequency signal and transmitting the frequency signal to a filter for reception among the first filter and the second filter, and a phase shifter for preventing the frequency signal from flowing from a filter for transmission among the first filter to the second filter, the filter for reception.

In an exemplary implementation of the present invention, the first filter comprises a plurality of sub-filters connected to each other, the sub-filter comprising the at least one series resonator, the at least two shunt resonators, and the first and second trimming inductors.

In an exemplary implementation of the present invention, the duplexer further comprises at least one attenuation resonator positioned between the plurality of sub-filters, and the first filter is the filter for transmission or the filter for reception.

In order to achieve the above-described aspects of exemplary embodiments of the present invention, there is provided a duplexer, comprising a first filter for filtering a frequency signal in a first band among frequency signals, the first filter comprising a plurality of sub-filters connected to each other for filtering the frequency signal, the sub-filter comprising at least one series resonator positioned between an input port for inputting the frequency signal and an output port for outputting the frequency signal, at least two shunt resonators respectively connected between the input and output ports and a ground, and a first trimming inductor for connecting the at least two shunt resonators and the ground. The duplexer is additionally provided with a second filter for filtering a frequency signal in a second band among frequency signals, an antenna for receiving the frequency signal and transmitting the frequency signal to a filter for reception among the first filter and the second filter, and a phase shifter for preventing the frequency signal from flowing from a filter for transmission among the first filter and the second filter to the filter for reception.

BRIEF DESCRIPTION OF THE DRAWINGS

The above and other aspects, features and advantages of certain exemplary embodiments of the present invention will be more apparent from the following detailed description taken in conjunction with the accompanying drawing, in which.

Throughout the drawings, the same drawing reference numerals will be understood to refer to the same elements, features and structures.

DETAILED DESCRIPTION OF EXEMPLARY EMBODIMENTS OF THE PRESENT INVENTION

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 2A:
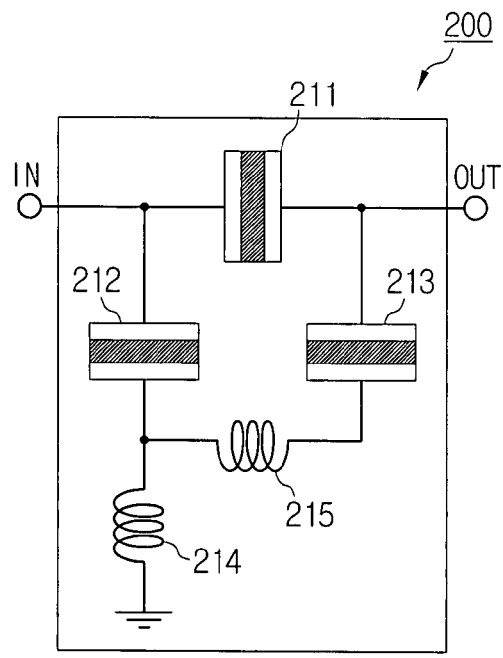
FIG. 2A illustrates an FBAR filter according to the first exemplary embodiment of the present invention.
Figure 2B:
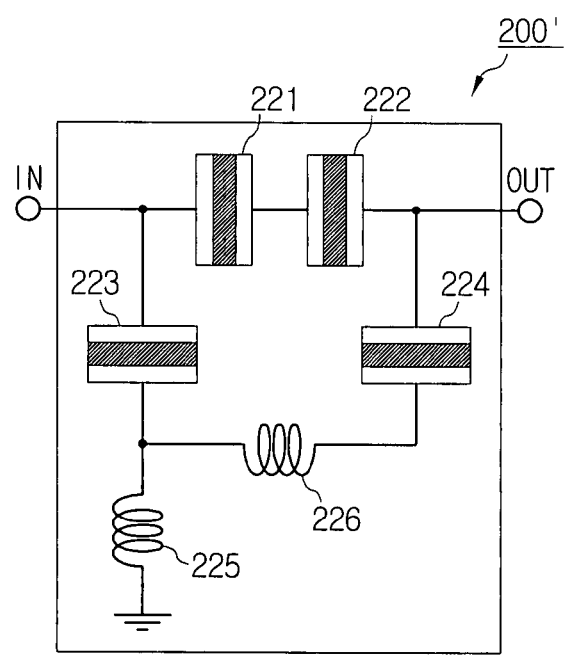
FIG. 2B illustrates an FBAR filter as in FIG. 2A having two series resonators.

FIG. 2A illustrates a film bulk acoustic resonator (FBAR) filter according to a first exemplary embodiment of the present invention, and FIG. 2B similarly illustrates an FBAR filter having two series resonators.

With reference to FIG. 2A, the FBAR filter 200 comprises a series resonator 211, a first shunt resonator 212, a second shunt resonator 213, a first trimming inductor 214, and a second trimming inductor 215.

The FBAR filter 200 is a band pass filter for passing signals within a desired frequency band. As the attenuation of signals within an undesired band is superior, the performance of the FBAR filter 200 is also enhanced.

The FBAR filter can be mass-produced at minimum cost and can easily be miniaturized and produced to be lightweight. Additionally, the FBAR filter uses system on chip (SOC) technology so that a plurality of elements are integrated on a single chip. As a result, data transmission time between the elements is reduced and a high level of stability is guaranteed.

The FBAR filter 200 according to the first exemplary embodiment of the present invention comprises the first shunt resonator 212 and second shunt resonator 213 which are connected in parallel, the first trimming inductor 214, and the second trimming inductor 215 to enhance attenuation properties and reduce the size and weight.

The series resonator 211 is disposed between an input port IN for inputting a frequency signal and an output port OUT for outputting a filtered frequency signal.

The first shunt resonator 212 and second shunt resonator 213 are disposed respectively between the input and output ports, IN and OUT, and a ground, and are connected to each other in parallel.

The first trimming inductor 214 is connected between the first and second shunt resonators 212 and 213 and the ground.

The second trimming inductor 215 is connected between the first shunt resonator 212 and the second shunt resonator 213. The optimum attenuation point of the FBAR filter 200 is determined by the first trimming inductor 214 and may change due to a fabrication error. The second trimming inductor 215 is used to compensate for the change of the attenuation point caused by the fabrication error.

The first trimming inductor 214 and second trimming inductor 215 can have a capacity of less than 0.5 nH. This can be explained with reference to FIG. 3 and Equation 1.

Figure 1:
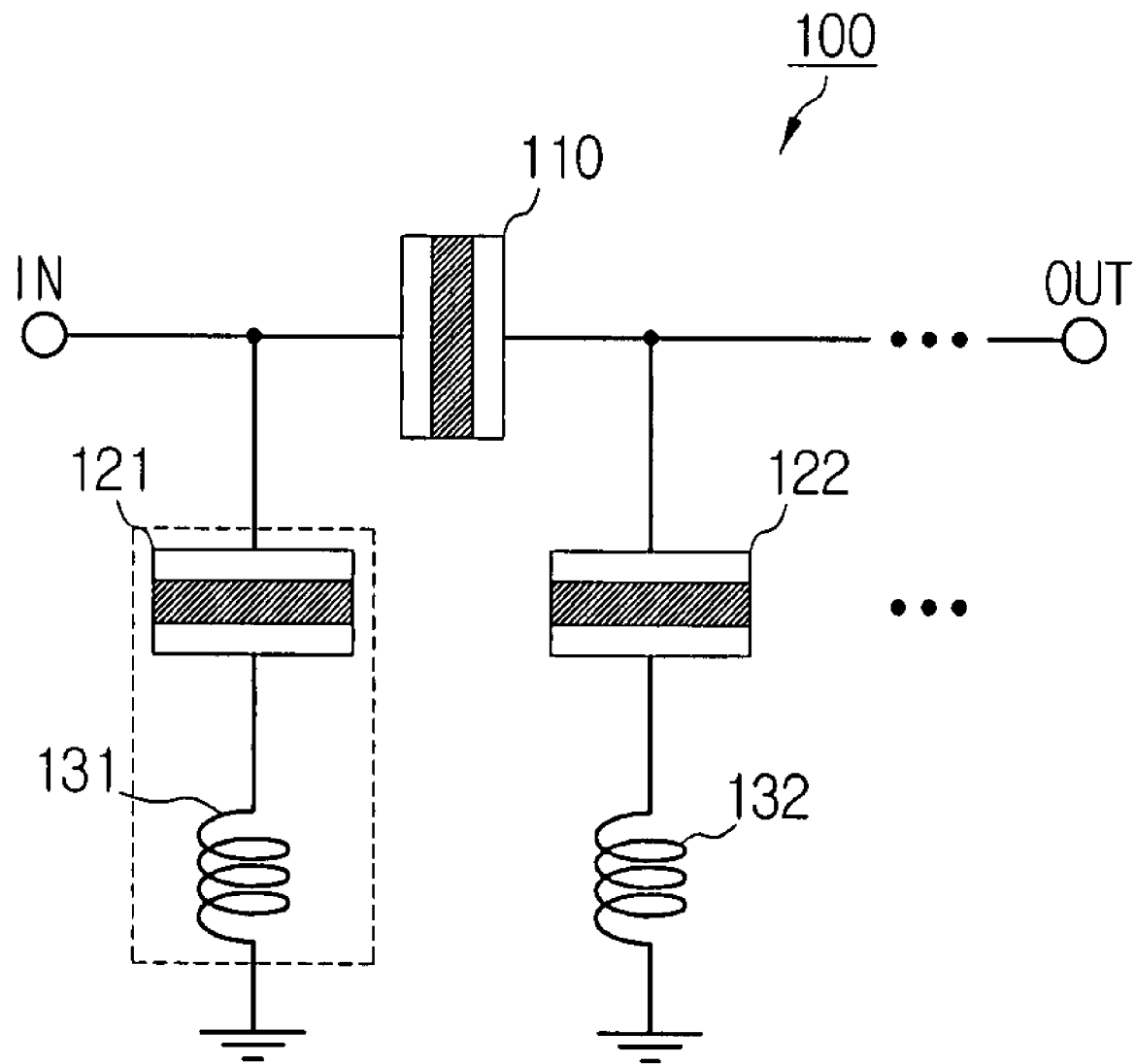
FIG. 1 illustrates a conventional filter.
Figure 3:
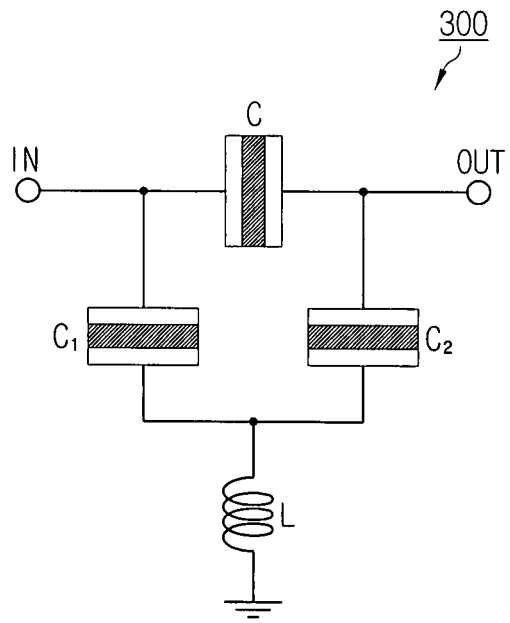
FIG. 3 illustrates an FBAR filter having two trimming inductors connected in parallel.

FIG. 3 illustrates an FBAR filter having two shunt resonators connected in parallel. In FIG. 3, a series resonator C, a first shunt resonator C1, a second shunt resonator C2 and a trimming inductor L function as an LC resonator to enhance attenuation of the point where LC resonance occurs. A resonance frequency is described using Equation 1:

$$f_{LC} = \frac{1}{2\pi}\sqrt{\frac{1}{LC}} \quad \text{[Equation 1]}$$

where $f_{LC}$ is the resonance frequency, L is the inductance capacity, and C is the capacitance. If a plurality of capacitors are connected in parallel, an equivalent capacitance is the sum of each capacitance connected in parallel. With reference to FIG. 3 and Equation 1, an equivalent capacitance by combination of the series resonator C, the first shunt resonator C1 and the second shunt resonator C2 is higher than that when having the single shunt resonator 121 as in FIG. 1.

If the equivalent capacitance increases due to the inductors having a parallel structure as in FIG. 3, the LC resonator maintains a resonance frequency by decreasing the capacity of the trimming inductor L. Accordingly, the LC resonance according to the present invention is formed by the method shown in FIG. 4, and is similar to that generated by the conventional filter of FIG. 1.

Therefore, the FBAR filter 300 can enhance attenuation properties even with a trimming inductor of low capacity by connecting a plurality of capacitors in parallel. More particularly, as the trimming inductor has a low capacity, the trimming inductor can be integrated on the same substrate to be on-chip when fabricating the FBAR filter, permitting a reduction in the size and weight of the filter 300.

Figure 4:
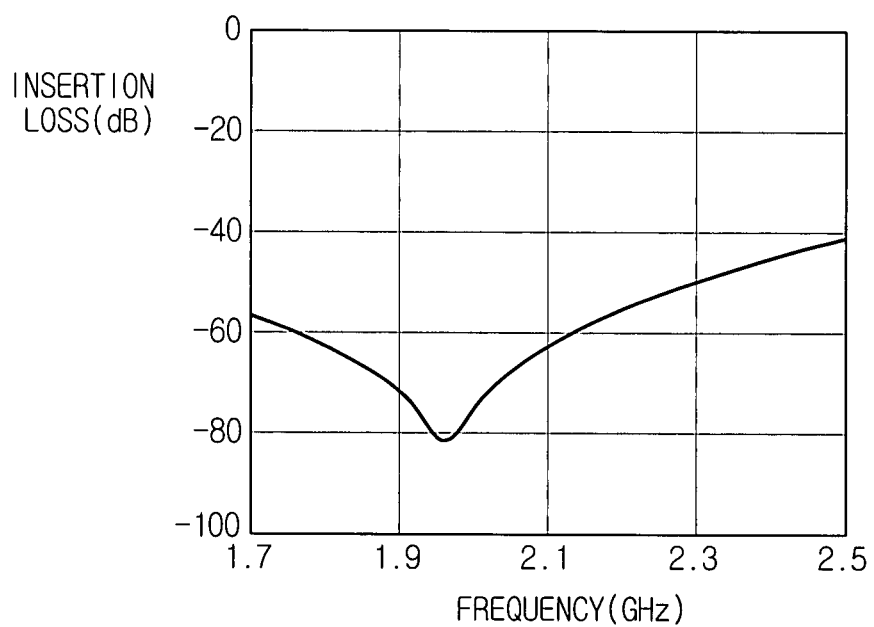
FIG. 4 illustrates a LC resonance waveform according to the topology of FIG. 3.

FIG. 4 illustrates a waveform of LC resonance according to the topology of FIG. 3, and the resonance frequency at which LC resonance occurs is approximately 700 MHz lower than the pass band of the FBAR filter 300. In this case, the attenuation properties of the FBAR filter 300 are significantly enhanced in the left frequency band of the pass band by the LC resonance.

The above discussed characteristics of the LC resonator are similarly derived from the FBAR filter 200 and 200' as in FIGS. 2A, 2B, 5, 6 and 8~12, so that enhanced attenuation properties are obtained.

With reference to FIG. 2B, the FBAR filter 200' comprises a series resonator 221, a second series resonator 222, a first shunt resonator 223, a second shunt resonator 224, a first trimming inductor 225, and a second trimming inductor 226. These components are similar to those of FIG. 2A, so detailed description is omitted.

In FIG. 2B, however, the first and second series resonators 221 and 222 are connected in series between an input port IN and an output port OUT, and also more than two series resonators may be implemented. If the first and second series resonators 221 and 222 are connected in series, the impedance properties of the FBAR filter 200' are enhanced. In addition, as discussed with reference to FIG. 3, the first and second trimming inductors 225 and 226 can have a capacity of less than 0.5 nH.

Figure 5:
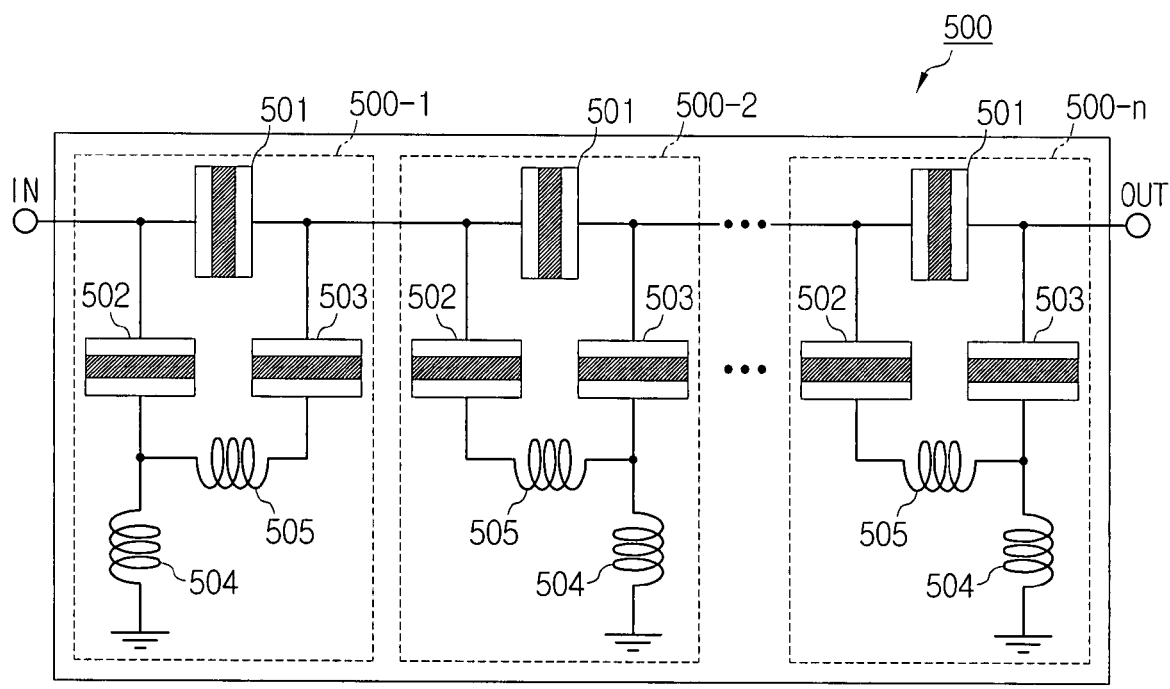
FIG. 5 illustrates an FBAR filter according to a second exemplary embodiment of the present invention.

FIG. 5 illustrates an FBAR filter according to a second exemplary embodiment of the present invention.

With reference to FIG. 5, the FBAR filter 500 comprises first to nth sub-filters 500-1, 500-2, . . . , 500-n (where n is a positive integer).

The first to nth sub-filters 500-1, 500-2, . . . , 500-n, respectively, comprise a series resonator 501, a first shunt resonator 502, a second shunt resonator 503, a first trimming inductor 504, and a second trimming inductor 505. These components are similar to those of FIG. 2A, so detailed description is omitted. The first to nth sub-filters 500-1, 500-2, . . . , 500-n are connected in series between an input port IN and an output port OUT.

Figure 6:
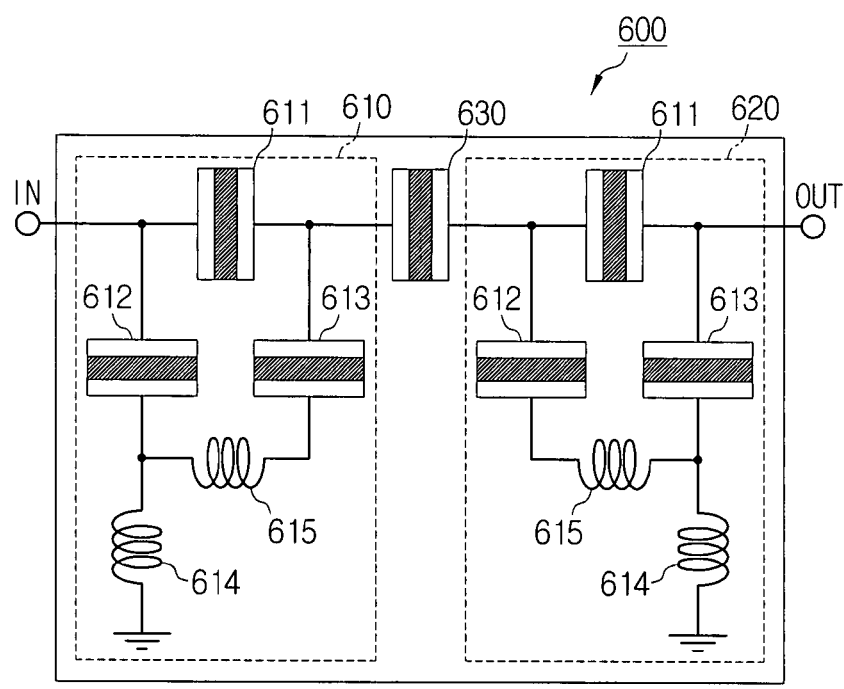
FIG. 6 illustrates an FBAR filter according to a third exemplary embodiment of the present invention.
Figure 7:
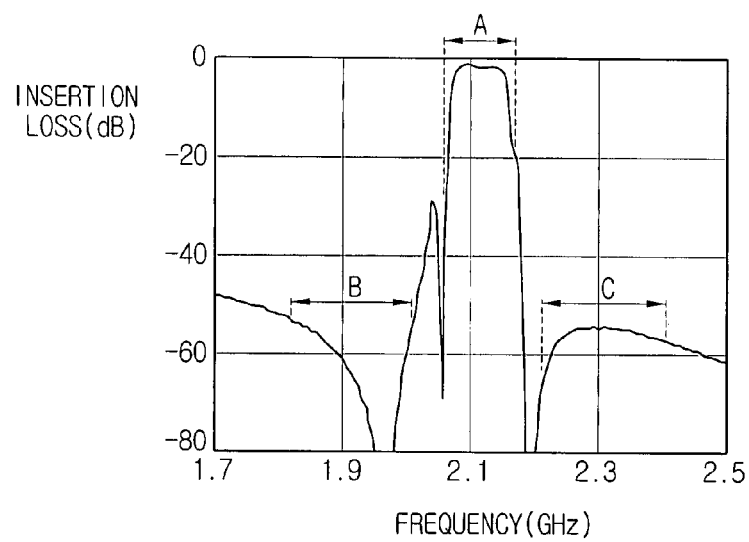
FIG. 7 is a graph illustrating a frequency response curve according to the topology of the FBAR filter of FIG. 6.

FIG. 6 illustrates an FBAR filter according to a third exemplary embodiment of the present invention, and FIG. 7 is a graph illustrating a frequency response curve according to the topology of the FBAR filter of FIG. 6.

With reference to FIG. 6, the FBAR filter 600 comprises a first sub-filter 610, a second sub-filter 620, and an attenuation resonator 630.

The first sub-filter 610 and the second sub-filter 620 each comprise a series resonator 611, a first shunt resonator 612, a second shunt resonator 613, a first trimming inductor 614, and a second trimming inductor 615. These components are similar to those of FIG. 2A, so detailed description is omitted.

The first sub-filter 610 and the second sub-filter 620 are connected in series between an input port IN and an output port OUT, and at least one attenuation resonator 630 is positioned between the first sub-filter 610 and the second sub-filter 620.

The attenuation resonator 630 may have a capacity higher than, the same as, or lower than the series resonators 611 on both sides thereof. The attenuation resonator 630 extends the range of resonance frequency by LC resonance.

In addition, according to the graph in FIG. 7, the FBAR filter 600 acts as a band pass filter to pass frequency signals within pass band A. Furthermore, when the attenuation resonator 630, is present the attenuation of the left area B or right area C of the pass band A in FIG. 7 occurs in a frequency range wider than when the attenuation resonator 630 is not present. Consequently, attenuation properties of the filter are enhanced.

Figure 8:
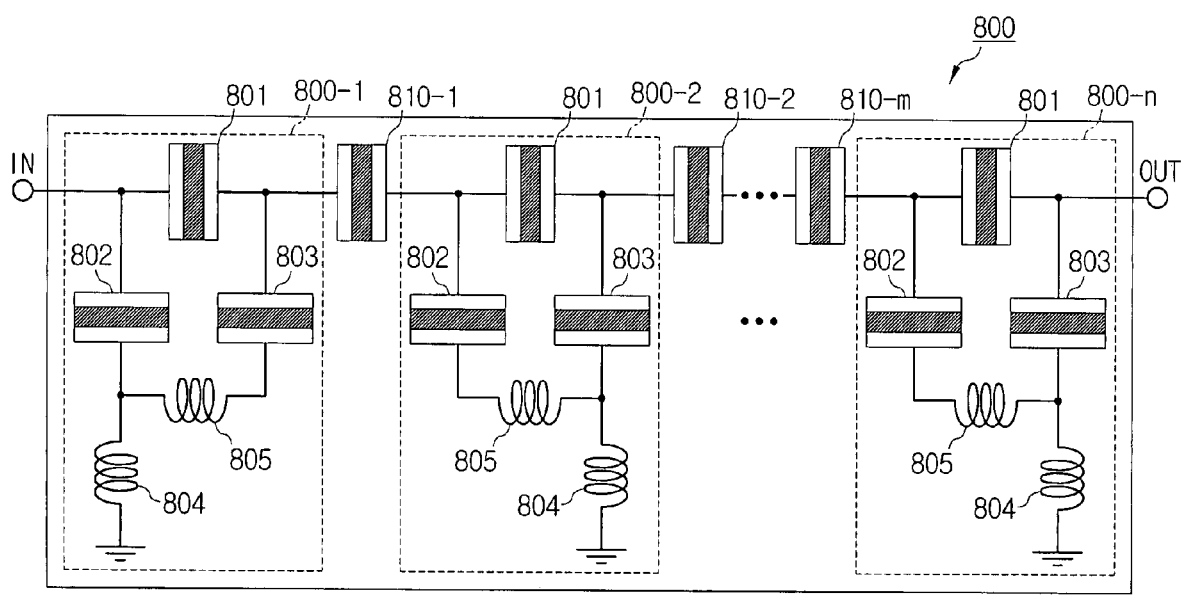
FIG. 8 illustrates an FBAR filter according to a fourth exemplary embodiment of the present invention.

FIG. 8 illustrates an FBAR filter according to a fourth exemplary embodiment of the present invention.

With reference to FIG. 8, the FBAR filter 800 comprises first to nth sub-filters 800-1, 800-2, . . . , 800-n (where n is a positive integer), and first to mth attenuation filters 810-1, 810-2, . . . , 810-m (where m is a positive integer).

The first to nth sub-filters 800-1, 800-2, . . . , 800-n each comprise a series resonator 801, a first shunt resonator 802, a second shunt resonator 803, a first trimming inductor 804, and a second trimming inductor 805. These components are similar to those of FIG. 2A, so detailed description is omitted.

The first to nth sub-filters 800-1, 800-2, . . . , 800-n are connected in series between an input port IN and an output port OUT. At least one of any one of the first to mth attenuation filters 810-1, 810-2, . . . , 810-m is positioned between any two consecutive sub-filters among the first to nth sub-filters 800-1, 800-2, . . . , 800-n. For example, the first attenuation resonator 810-1 is positioned between the first sub-filter 800-1 and the second sub-filter 800-2, and the second attenuation resonator 810-2 is positioned between the second sub-filter 800-2 and the third sub-filter (not shown). Also, the first and second attenuation resonator 810-1 and 810-2 may be positioned between the first sub-filter 800-1 and the second sub-filter 800-2.

Figure 9:
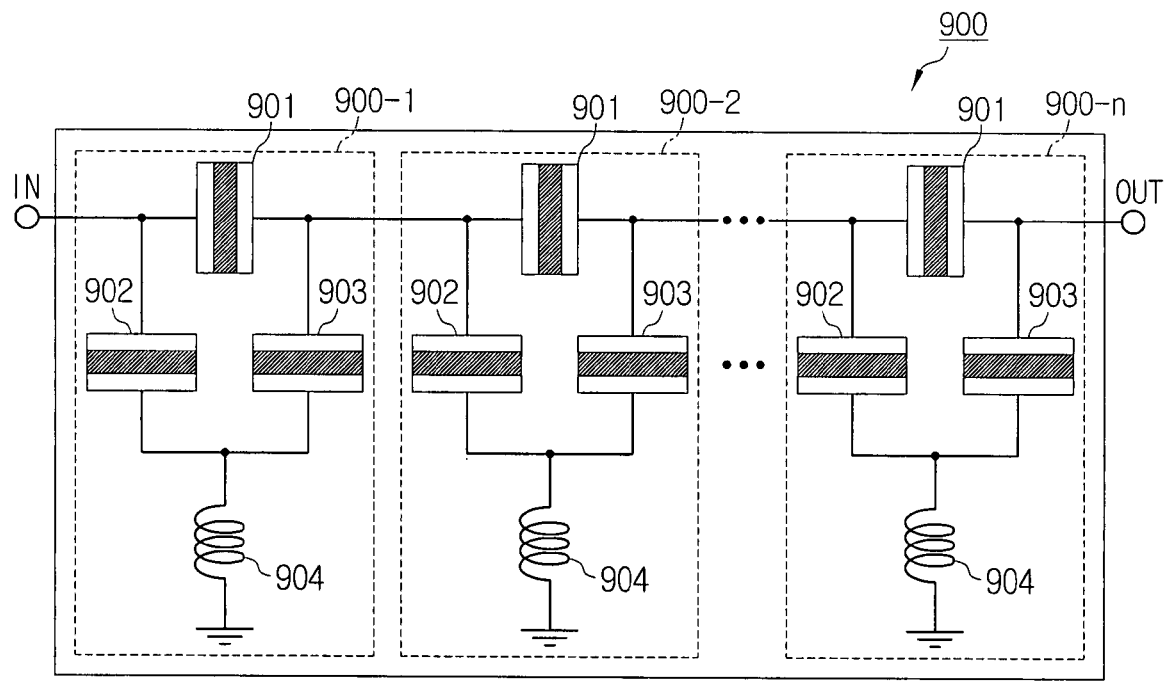
FIG. 9 illustrates an FBAR filter according to a fifth exemplary embodiment of the present invention.

FIG. 9 illustrates an FBAR filter according to a fifth exemplary embodiment of the present invention.

With reference to FIG. 9, the FBAR filter 900 comprises first to nth sub-filters 900-1, 900-2, ..., 900-n (where n is a positive number).

The first to nth sub-filters 900-1, 900-2, ..., 900-n each comprise a series resonator 901, a first shunt resonator 902, a second shunt resonator 903, and a trimming inductor 904. These components are similar to those of FIG. 2A, so detailed description is omitted. The first to nth sub-filters 900-1, 900-2, ..., 900-n are connected in series between an input port IN and an output port OUT. The first and second shunt resonators 902 and 903 are connected to each other in parallel.

Figure 10:
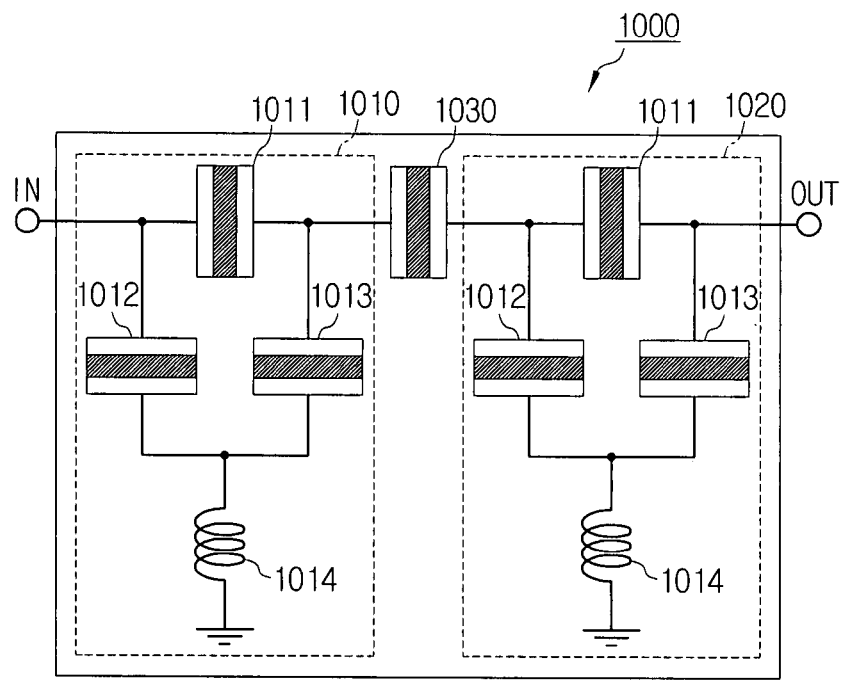
FIG. 10 illustrates an FBAR filter according to a sixth exemplary embodiment of the present invention.

FIG. 10 illustrates an FBAR filter according to a sixth exemplary embodiment of the present invention.

With reference to FIG. 10, the FBAR filter 1000 comprises a first sub-filter 1010, a second sub-filter 1020, and an attenuation resonator 1030.

The first sub-filter 1010 and second sub-filter 1020 each comprise a series resonator 1011, a first shunt resonator 1012, a second shunt resonator 1013, and a trimming inductor 1014. These components are similar to those of FIG. 2A, so detailed description is omitted.

The first sub-filter 1010 and second sub-filter 1020 are connected in series between an input port IN and an output port OUT. At least one attenuation resonator 1030 is positioned between the first sub-filter 1010 and the second sub-filter 1020. The attenuation resonator 1030 performs the same operation as that of FIG. 6, so detailed description is omitted.

Figure 11:
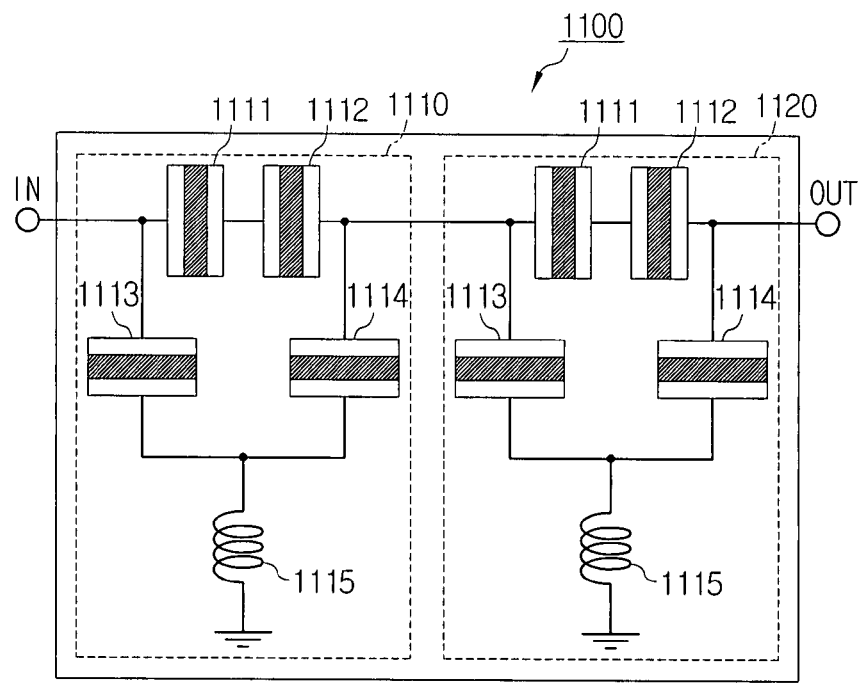
FIG. 11 illustrates an FBAR filter as in FIG. 9 having two series resonators.

FIG. 11 illustrates an FBAR filter having two series resonators as in FIG. 9.

With reference to FIG. 11, the FBAR filter 1100 comprises a first sub-filter 1110 and a second sub-filter 1120. The first sub-filter 1110 and second sub-filter 1120 each comprise a first series resonator 1111, a second series resonator 1112, a first shunt resonator 1113, a second shunt resonator 1114, and a trimming inductor 1115. These components are similar to those of FIG. 2A, so detailed description is omitted.

However, the first sub-filter 1110 and second sub-filter 1120 are connected in series between an input port IN and an output port OUT, and there may be more than two sub-filters. The first series resonator 1111 and the second series resonator 1112 are connected to each other in series and there is no limitation on the number of series resonators which may be connected in series. If a plurality of series resonators are connected in series, the impedance characteristic of the FBAR filter 1100 is enhanced. In addition, the trimming inductor 1115 can have a capacity of less than 0.5 nH.

Figure 12:
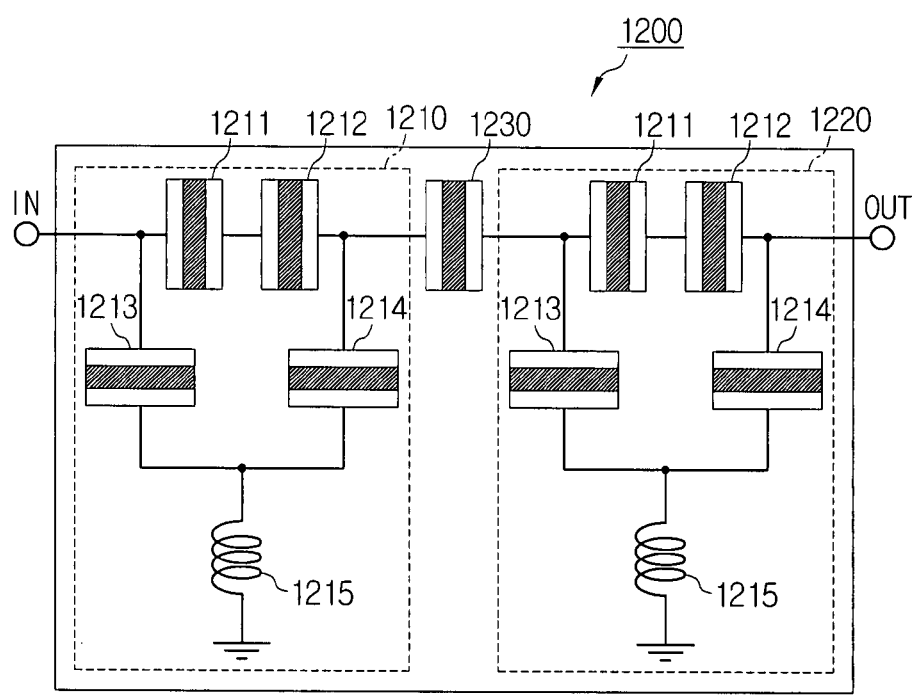
FIG. 12 illustrates an FBAR filter according to a seventh exemplary embodiment of the present invention.

FIG. 12 illustrates an FBAR filter according to a seventh exemplary embodiment of the present invention.

With reference to FIG. 12, the FBAR filter 1200 comprises a first sub-filter 1210, a second sub-filter 1220, and an attenuation resonator 1230.

The first sub-filter 1210 and the second sub-filter 1220 each comprise a first series resonator 1211, a second series resonator 1212, a first shunt resonator 1213, a second shunt resonator 1214, and a trimming inductor 1215. These components are similar to those of FIG. 11, so detailed description is omitted.

The first sub-filter 1210 and the second sub-filter 1220 are connected in series between an input port IN and an output port OUT, and at least one attenuation resonator 1230 is positioned between the first sub-filter 1210 and the second sub-filter 1220. The attenuation resonator 1230 performs the same operation as that of FIG. 6, so detailed description is omitted.

In the FBAR filters 200, 200', 500, 600, 800, 900, 1000, 1100 and 1200 according to the first to seventh exemplary embodiments of the present invention, as a plurality of shunt resonators are connected in parallel, inductors of different capacity can be used. Accordingly, the trimming inductor can be integrated on the same substrate to be on-chip when fabricating the FBAR filter, permitting a reduction in the size and weight of the filter.

Hereinbelow, a duplexer employing the FBAR filter according to the present invention is discussed.

A duplexer is a core component which is connected to an antenna of a mobile communication device, and which divides transmission and reception frequencies of the mobile communication device to prevent false crossing of signals. To this end, the duplex has at least two band pass filters having different center frequencies.

Figure 13:
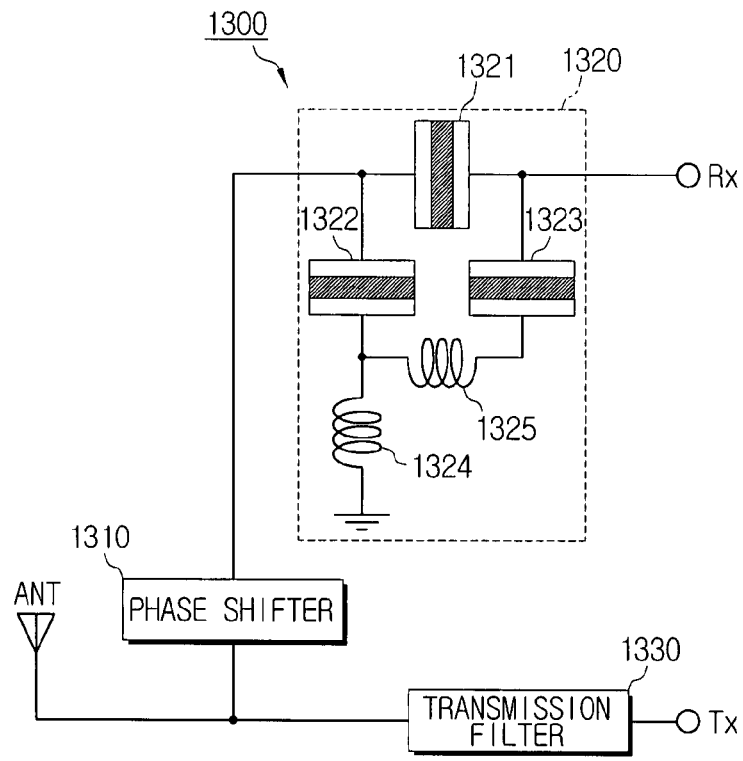
FIG. 13 illustrates a duplexer according to the first exemplary embodiment of the present invention.

FIG. 13 illustrates a duplexer according to the first exemplary embodiment of the present invention.

With reference to FIG. 13, the duplexer 1300 comprises a phase shifter 1310, a first filter 1320, and a second filter 1330.

The phase shifter 1310 is positioned between an antenna ANT and the first filter 1320, and shifts the phase of a frequency signal received from the antenna ANT. For example, the phase shifter 1310 shifts the phase of a received frequency signal by 90°.

The first filter 1320 is a reception filter which filters a frequency signal in a first band among the frequency signals phase-shifted by the phase shifter 1310 and transmits the filtered frequency signal to a reception circuit Rx. Additionally, the first filter 1320 attenuates a frequency signal output for transmission from a transmission circuit Tx so that the frequency signal does not flow into the first filter 1320.

To achieve this, the first filter 1320 is implemented as an FBAR filter, comprising a series resonator 1321, a first shunt resonator 1322, a second shunt resonator 1323, a first trimming inductor 1324, and a second trimming inductor 1325. These components are similar to those of FIG. 2A, so detailed description is omitted.

The second filter 1330 is a transmission filter which filters a frequency signal of a preset second band among frequency signals input from the transmission circuit Tx, and outputs the filtered frequency signal to the antenna ANT, and is implemented as an FBAR filter.

Figure 14:
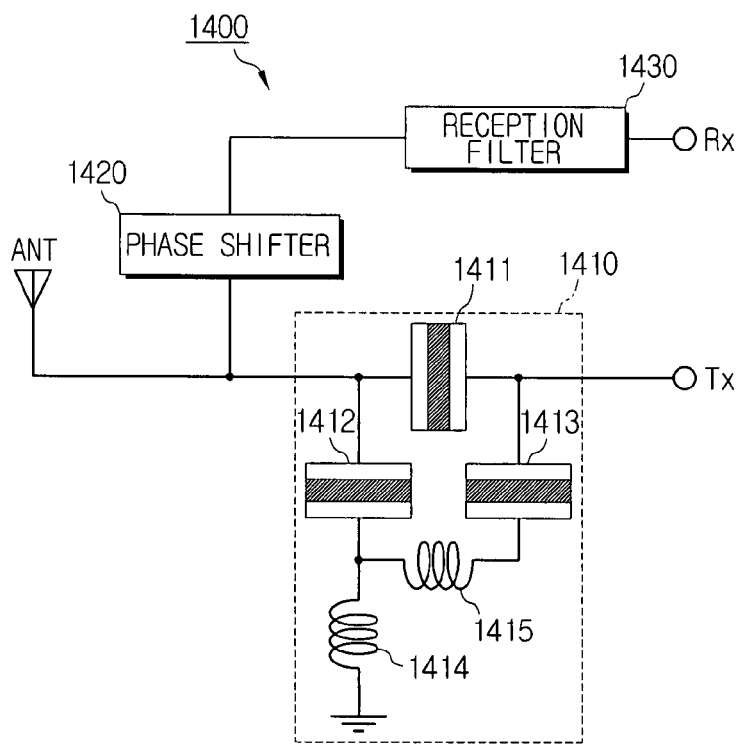
FIG. 14 illustrates a duplexer according to the second exemplary embodiment of the present invention.

FIG. 14 illustrates a duplexer according to the second exemplary embodiment of the present invention.

With reference to FIG. 14, the duplexer 1400 comprises a first filter 1410, a phase shifter 1420, and a second filter 1430.

The first filter 1410 is a transmission filter which filters a frequency signal in a preset first band among frequency signals input from the transmission circuit Tx and outputs the filtered frequency signal to the antenna ANT.

To do so, the first filter 1410 is implemented as an FBAR filter, comprising a series resonator 1411, a first shunt resonator 1412, a second shunt resonator 1413, a first trimming inductor 1414, and a second trimming inductor 1415. These components are similar to those of FIG. 2A, so detailed description is omitted.

The phase shifter 1420 is positioned between an antenna ANT and the second filter 1430, and shifts the phase of a frequency signal received from the antenna ANT.

The second filter 1430 is a reception filter which filters a frequency signal of a second band among the frequency signals phase-shifted by the phase shifter 1420 and transmits the filtered frequency signal to a reception circuit Rx. Additionally, the second filter 1430 attenuates a frequency signal output for transmission from a transmission circuit Tx so that the frequency signal does not flow into the second filter 1430.

The first filters 1330 and 1410 of FIGS. 13 and 14 are not limited to the FBAR filter 200 of FIG. 2A, and may also be implemented as the FBAR filters 200', 500, 600 and 800 of FIGS. 2B, 5, 6 and 8.

Figure 15:
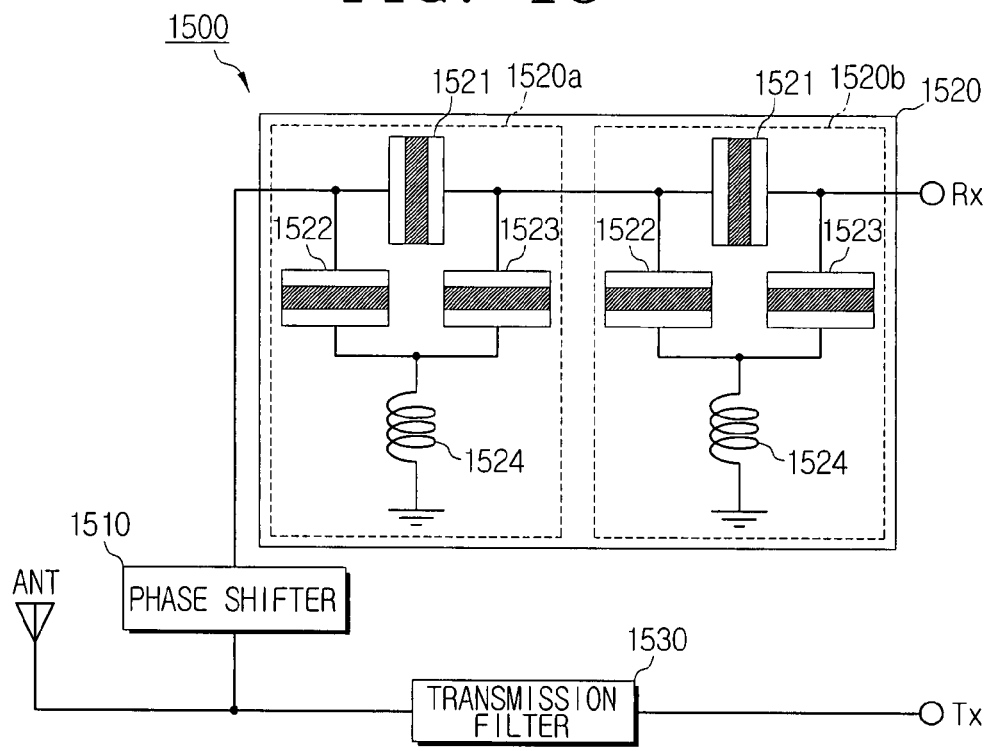
FIG. 15 illustrates a duplexer according to the third exemplary embodiment of the present invention.

FIG. 15 illustrates a duplexer according to the third exemplary embodiment of the present invention.

With reference to FIG. 15, the duplexer 1500 comprises a phase shifter 1510, a first filter 1520, and a second filter 1530. The phase shifter 1510 and the second filter 1530 are similar to those of FIG. 13, so detailed description is omitted.

The first filter 1520 for reception is configured with first and second sub-filters 1520A and 1520B which are connected to each other in series. The first and second sub-filters 1520A and 1520B each comprise a series resonator 1521, a first shunt resonator 1522, a second shunt resonator 1523, and a trimming inductor 1524. These components are similar to those of FIG. 9, so detailed description is omitted.

Figure 16:
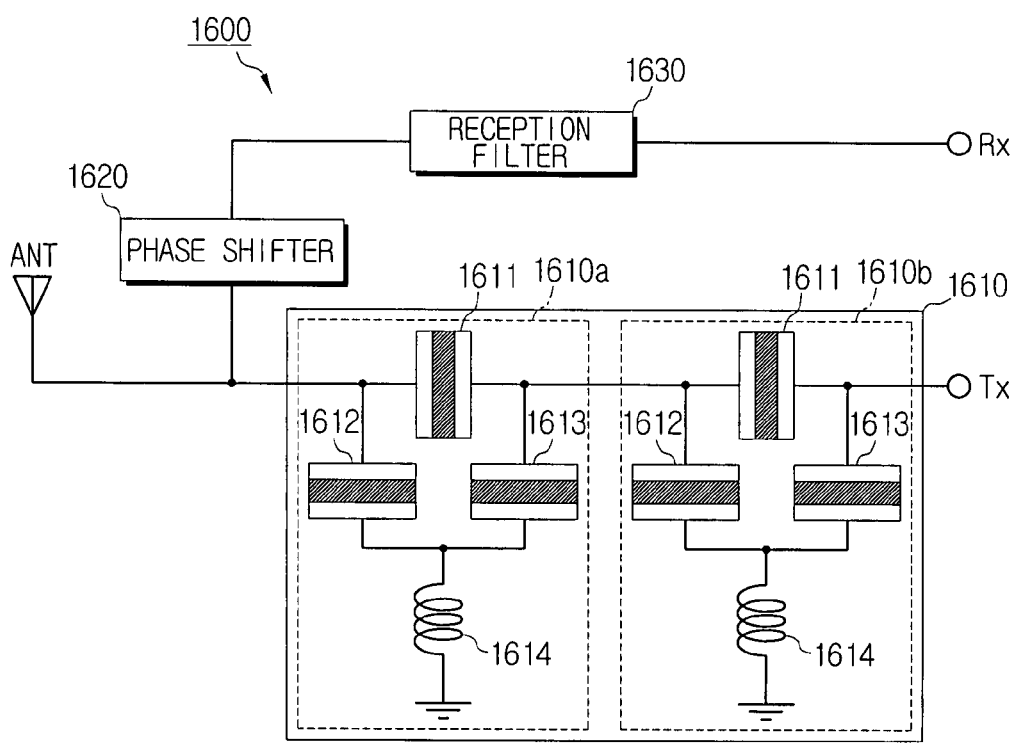
FIG. 16 illustrates a duplexer according to the fourth exemplary embodiment of the present invention.

FIG. 16 illustrates a duplexer according to the fourth exemplary embodiment of the present invention.

With reference to FIG. 16, the duplexer 1600 comprises a first filter 1610, a phase shifter 1620, and a second filter 1630. The phase shifter 1620 and the second filter 1630 are similar to those of FIG. 14, so detailed description is omitted.

The first filter 1610 for transmission filters a frequency signal in a preset first band among frequency signals input from a transmission circuit Tx and outputs the filtered frequency signal to the antenna ANT, and is implemented as an FBAR filter.

To achieve this, the first filter 1610 is configured with first and second sub-filters 1610A and 1610B which are connected to each other in series. The first and second sub-filters 1610A and 1610B each comprise a series resonator 1611, a first shunt resonator 1612, a second shunt resonator 1613, and a trimming inductor 1614. These components are similar to those of FIG. 9, so detailed description is omitted.

The first filters 1520 and 1610 of FIGS. 15 and 16 are not limited to the FBAR filter 900 of FIG. 9, and may also be implemented as the FBAR filters 1000, 1100 and 1200 of FIGS. 10-12.

In the above exemplary embodiments, even if the trimming inductor has a capacity of less than 0.5 nH, attenuation properties are enhanced and on-chip fabrication is enabled due to the features described with reference to FIG. 3.

Further, in the above exemplary embodiments, if a plurality of series resonators are used, the size of the series resonators may be the same or different, and if a plurality of trimming resonators are used, the size of the trimming resonators may be the same or different. That is, the size of series resonators or trimming resonators may be adjustable considering the properties of the filter.

As can be appreciated from the above description of an FBAR filter and a duplexer according to the present invention, the attenuation properties of the filter can be enhanced by connecting at least two shunt resonators in parallel with at least one trimming inductor of the low capacity.

Also, a plurality of resonators and at least one trimming inductor can be fabricated on a single substrate due to the trimming inductor having a capacity of less than 0.5 nH, resulting in a reduction in the size of the filter and simplification of the fabricating process.

Furthermore, the impedance properties of the FBAR filter can be enhanced by connecting a plurality of series resonators in series.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A film bulk acoustic resonator (FBAR) filter, comprising:
    at least one series resonator positioned between an input port for inputting a frequency signal and an output port for outputting a frequency signal;
    at least two shunt resonators respectively positioned between the input and output ports and a ground;
    a first trimming inductor for connecting the at least two shunt resonators and the ground; and
    a second trimming inductor positioned between the at least two shunt resonators, one end of which is connected to a node between one shunt resonator and ground, and the other end of which is only connected to the other shunt resonator directly;
    wherein a plurality of sub-filters, comprising the at least one series resonator, the at least two shunt resonators, and the first and second trimming inductors, are connected to each other such that each of the sub-filters are connected in series, and at least one attenuation resonator is positioned in series between each of the plurality of sub-filters.

2. The FBAR filter of claim 1, wherein the first and second trimming inductors are integrally packaged with the series resonator and the shunt resonators.

3. The FBAR filter of claim 1, wherein the at least one series resonator includes at least one series FBAR resonator.

4. The FBAR filter of claim 1, wherein the at least two shunt resonators include at least two shunt FBAR resonators.

5. The FBAR filter of claim 1, wherein the second trimming inductor is directly connected to each of the at least two shunt resonators, and is connected to one end of the first trimming inductor.

6. A duplexer, comprising:
    a first filter for filtering a frequency signal in a first band among frequency signals;
    a second filter for filtering a frequency signal in a second band among frequency signals;
    an antenna for receiving the frequency signal and transmitting the frequency signal to a filter for reception among the first filter and the second, filter; and
    a phase shifter for preventing the frequency signal from flowing from a filter for transmission among the first filter and the second filter, to the filter for reception;
    wherein the first filter comprises a plurality of sub-filters connected to each other such that each of the sub-filters are connected in series, each sub-filter comprising at least one series resonator, at least two shunt resonators, a first trimming inductor for connecting the at least two shunt resonators and a ground, and a second trimming inductor, and at least one attenuation resonator is positioned in series between each of the plurality of sub-filters, the second trimming inductor is positioned between the at least two shunt resonators, one end of the second trimming inductor is connected to a node between one shunt resonator and ground, and the other end of the second trimming inductor is only connected to the other shunt resonator directly.

7. The duplexer of claim 6, wherein the first filter is the filter for transmission or the filter for reception.

8. The duplexer of claim 6, wherein the at least one series resonator includes at least one series FBAR resonator.

9. The duplexer of claim 6, wherein the at least two shunt resonators include at least two shunt FBAR resonators.

10. The duplexer of claim 6, wherein the second trimming inductor is directly connected to each of the at least two shunt resonators, and is connected to one end of the first trimming inductor.

* * * * *